(12) United States Patent
Im et al.

(10) Patent No.: US 7,160,763 B2
(45) Date of Patent: Jan. 9, 2007

(54) POLYCRYSTALLINE TFT UNIFORMITY THROUGH MICROSTRUCTURE MIS-ALIGNMENT

(75) Inventors: James Im, New York, NY (US); Paul Christiaan Van Der Wilt, Leiden MB (NL)

(73) Assignee: The Trustees of Columbia University in the City of New York, New York, NY (US)

(*) Notice: Subject to any disclaimer, the term of this patent is extended or adjusted under 35 U.S.C. 154(b) by 0 days.

(21) Appl. No.: 10/487,170

(22) PCT Filed: Aug. 27, 2002

(86) PCT No.: PCT/US02/27246

§ 371 (c)(1),
(2), (4) Date: Sep. 10, 2004

(87) PCT Pub. No.: WO03/018882

PCT Pub. Date: Mar. 6, 2003

(65) Prior Publication Data

US 2005/0034653 A1 Feb. 17, 2005

Related U.S. Application Data

(60) Provisional application No. 60/315,181, filed on Aug. 27, 2001.

(51) Int. Cl.
*H01L 21/00* (2006.01)
(52) U.S. Cl. ............... 438/150; 438/149; 438/151; 438/158
(58) Field of Classification Search ......... 438/150, 438/149, 151, 158, 197
See application file for complete search history.

(56) References Cited

U.S. PATENT DOCUMENTS

| | | | |
|---|---|---|---|
| 3,632,205 A | 1/1972 | Marcy | |
| 4,234,358 A | 11/1980 | Celler et al. | |
| 4,309,225 A | 1/1982 | Fan et al. | |
| 4,382,658 A | 5/1983 | Shields et al. | |
| 4,456,371 A | 6/1984 | Lin | |
| 4,639,277 A | 1/1987 | Hawkins | |
| 4,691,983 A | 9/1987 | Kobayashi et al. | |
| 4,727,047 A | 2/1988 | Bolzer et al. | |
| 4,758,533 A | 7/1988 | Magee et al. | |
| 4,793,694 A | 12/1988 | Liu | |
| 4,800,179 A | 1/1989 | Mukai | |
| 4,855,014 A | 8/1989 | Kakimoto et al. | |
| 4,870,031 A | 9/1989 | Suguhara et al. | |
| 4,940,505 A | 7/1990 | Schachameyer et al. | |
| 4,970,546 A | 11/1990 | Suzuki et al. | |
| 4,977,104 A | 12/1990 | Sawada et al. | |

(Continued)

FOREIGN PATENT DOCUMENTS

EP 681316 8/1995

(Continued)

OTHER PUBLICATIONS

U.S. Appl. No. 60/253,256, filed Aug. 31, 2003, Im.

(Continued)

*Primary Examiner*—Thao P. Le
(74) *Attorney, Agent, or Firm*—Baker Botts, LLP

(57) ABSTRACT

Methods of making a polycrystalline silicon thin-film transistor having a uniform microstructure. One exemplary method requires receiving a polycrystalline silicon thin film having a grain structure which is periodic in at least a first direction, and placing at least portions (410, 420) of one or more thin-film transistors on the received film such that they are tilted relative to the periodic structure of the thin film.

19 Claims, 3 Drawing Sheets

U.S. PATENT DOCUMENTS

| | | |
|---|---|---|
| 5,032,233 A | 7/1991 | Yu et al. |
| 5,061,655 A | 10/1991 | Ipposhi et al. |
| RE33,836 E | 3/1992 | Resor, III et al. |
| 5,145,808 A | 9/1992 | Sameshima et al. |
| 5,204,659 A | 4/1993 | Sarma |
| 5,233,207 A | 8/1993 | Anzai |
| 5,285,236 A | 2/1994 | Jain |
| 5,291,240 A | 3/1994 | Jain |
| 5,304,357 A | 4/1994 | Sato et al. |
| 5,373,803 A | 12/1994 | Noguchi et al. |
| 5,395,481 A | 3/1995 | McCarthy |
| 5,409,867 A | 4/1995 | Asano |
| 5,453,594 A | 9/1995 | Konecny |
| 5,456,763 A | 10/1995 | Kaschmitter et al. |
| 5,496,768 A | 3/1996 | Kudo |
| 5,523,193 A | 6/1996 | Nelson |
| 5,529,951 A | 6/1996 | Noguchi et al. |
| 5,534,716 A * | 7/1996 | Takemura .................... 257/72 |
| 5,591,668 A | 1/1997 | Maegawa et al. |
| 5,614,426 A * | 3/1997 | Funada et al. ............. 438/150 |
| 5,616,506 A | 4/1997 | Takemura .................... 438/150 |
| 5,696,388 A * | 12/1997 | Funada et al. ................ 257/64 |
| 5,721,606 A | 2/1998 | Jain |
| 5,742,426 A | 4/1998 | York |
| 5,756,364 A | 5/1998 | Tanaka et al. |
| 5,766,989 A | 6/1998 | Maegawa et al. |
| 5,844,588 A | 12/1998 | Anderson |
| 5,861,991 A | 1/1999 | Fork |
| 5,893,990 A | 4/1999 | Tanaka |
| 5,986,807 A | 11/1999 | Fork |
| 6,014,944 A | 1/2000 | Russell et al. |
| 6,072,631 A | 6/2000 | Guenther et al. |
| 6,081,381 A | 6/2000 | Shalapenok et al. |
| 6,093,934 A * | 7/2000 | Yamazaki et al. .............. 257/51 |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,177,301 B1 * | 1/2001 | Jung .......................... 438/150 |
| 6,187,088 B1 | 2/2001 | Okumura |
| 6,190,985 B1 | 2/2001 | Buynoski |
| 6,193,796 B1 | 2/2001 | Yang |
| 6,203,952 B1 | 3/2001 | O'Brien et al. |
| 6,235,614 B1 | 5/2001 | Yang |
| 6,242,291 B1 | 6/2001 | Kusumoto et al. |
| 6,255,146 B1 * | 7/2001 | Shimizu et al. ............. 438/162 |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B1 | 11/2001 | Im |
| 6,326,286 B1 | 12/2001 | Park et al. |
| 6,333,232 B1 | 12/2001 | Kunikiyo |
| 6,368,945 B1 | 4/2002 | Im |
| 6,388,146 B1 | 5/2002 | Onishi et al. |
| 6,407,012 B1 | 6/2002 | Miyasaka et al. |
| 6,444,506 B1 | 9/2002 | Kusumoto et al. |
| 6,468,845 B1 | 10/2002 | Nakajima et al. |
| 6,495,067 B1 | 12/2002 | Ono |
| 6,511,718 B1 | 1/2003 | Paz de Araujo et al. |
| 6,521,473 B1 * | 2/2003 | Jung ............................ 438/30 |
| 6,521,492 B1 | 2/2003 | Miyasaka et al. |
| 6,526,585 B1 | 3/2003 | Hill |
| 6,528,359 B1 | 3/2003 | Kusumoto et al. |
| 6,555,449 B1 | 4/2003 | Im et al. |
| 6,563,077 B1 | 5/2003 | Im |
| 6,573,531 B1 | 6/2003 | Im et al. |
| 6,582,827 B1 | 6/2003 | Im |
| 6,621,044 B1 | 9/2003 | Jain et al. |
| 6,635,554 B1 | 10/2003 | Im et al. |
| 6,744,069 B1 * | 6/2004 | Yamazaki et al. ............. 257/72 |
| 6,830,993 B1 | 12/2004 | Im et al. |
| 2001/0001745 A1 | 5/2001 | Im et al. |
| 2001/0041426 A1 | 11/2001 | Im |
| 2002/0104750 A1 | 8/2002 | Ito |
| 2003/0029212 A1 | 2/2003 | Im |
| 2003/0096489 A1 | 5/2003 | Im et al. |
| 2003/0119286 A1 | 6/2003 | Im et al. |
| 2004/0053450 A1 | 3/2004 | Sposili et al. |
| 2004/0061843 A1 | 4/2004 | Im |
| 2005/0032249 A1 | 2/2005 | Im et al. |
| 2005/0034653 A1 | 2/2005 | Im et al. |

FOREIGN PATENT DOCUMENTS

| | | |
|---|---|---|
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | 62181419 | 8/1987 |
| JP | 2283036 | 11/1990 |
| JP | 04033327 | 2/1992 |
| JP | 6252048 | 9/1994 |
| JP | 6283422 | 10/1994 |
| JP | 7176757 | 7/1995 |
| JP | 11064883 | 3/1999 |
| JP | 2001023920 | 1/2001 |
| WO | 9745827 | 12/1997 |
| WO | 9824118 | 6/1998 |
| WO | 9931719 | 6/1999 |
| WO | 0014784 | 3/2000 |
| WO | 0118854 | 3/2001 |
| WO | 0118855 | 3/2001 |
| WO | 0171786 | 9/2001 |
| WO | 02031869 | 4/2002 |
| WO | 0242847 | 5/2002 |
| WO | 02086954 | 5/2002 |
| WO | 02086955 | 10/2002 |
| WO | 03018882 | 3/2003 |
| WO | 03046965 | 6/2003 |
| WO | 04075263 | 8/2003 |
| WO | 03084688 | 10/2003 |
| WO | 04017379 | 2/2004 |
| WO | 04017380 | 2/2004 |
| WO | 04017381 | 2/2004 |
| WO | 04017382 | 2/2004 |

OTHER PUBLICATIONS

Im et al., "Controlled Super-Lateral Growth of Si Films for Microstructural Manipulation and Optimization", Phys. Stat. Sol. (a), vol. 166, p. 603 (1998).

S.D. Brotherton et al., "Influence of Melt Depth in Laser Crystallized Poly-Si Thin Film Transistors," 82 J. Appl. Phys. 4086 (1997).

J.S. Im et al., "Crystalline Si Films for Integrated Active-Matrix Liquid-Crystals Displays," 21 MRS Bulletin 39 (1996).

Im et al., "Single-Crystal Si Films for Thin-Film Transistor Devices," Appl. Phys. Lett., vol. 70 (25), p. 3434 (1997).

Sposili et al., "Sequential Lateral Solidification of Thin Silicon Films on SiO2", Appl, Phys. Lett., vol. 69 (19), p. 2864 (1996).

Crowder et al., "Low-Temperature Single-Crystal Si TFT's Fabricated on Si Films processed via Sequential Lateral Solidification", IEEE Electron Device Letter, vol. 19 (8), p. 306 (1998).

Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Reasearch Society.

C. E. Nebel, "Laser Interference Structuring of A-SI:h" Amorphous Silicon Technology—1996, San Francisco, CA Apr. 8-12, 1996, Materials Research Society Symposium Proceedings, vol. 420, Pittsburgh, PA.

J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.

H. Endert et al., "Excimer Laser: A New Tool for Precision Micromaching," 27 Optical and Quantum Electronics, 1319 (1995).

"Overview of Beam Delivery Systems for Excimer Lasers," Micro/Las Lasersystem GMBH.

K.H. Weiner et al., "Ultrashallow Junction Formation Using Projection Gas Immersion Laser Doping (PGILD)," A Verdant Technologies Technical Brief, Aug. 20, 1997.

Hau-Riege C.S. et al., "The Effects Microstructural Transitions at Width Transitions on interconnect reliability," Journal of Applied Physics, Jun. 15, 2000, vol. 87, No. 12, pp. 8467-8472.

McWilliams et al., "Wafer-Scale Laser Pantography: Fabrication of N-Metal-Oxide-Semiconductor Transistors and Small-Scale Integrated Circuits By Direct-Write Laser-Induced Pyrolytic Reactions," Applied Physics Letters, American Institute of Physics, New York, US, vol. 43, No. 10, Nov. 1983, pp. 946-948.

Mariucci et al., "Grain boundary location control by patterned metal film in excimer laser crystallized polysilicon," Proceedings of the Figth International COnference on Polycrystalline Semiconductors, Schwabisch Gmund, Germany, Sep. 13-18, 1998, vol. 67-68, pp. 175-180.

Broadbent et al., "Excimer Laser Processing of A1-1%Cu/TiW Interconnect Layers," 1989 Proceedings, Sixth International IEEE VLSI Multilevel Interconnection COnference, Santa Clara, CA, Jun. 12-13, 1989, pp. 336-345.

H.J. Kim and James S. Im, "Grain Boundary Location-Controlled Poly-Si Films for TFT Devices Obtained Via Novel Excimer Laser Process," Abstracts for Symposium of Materials Research Society, Nov. 27 to Dec. 2, 1994, p. 230.

S.D. Brotherton, "Polycrystalline Silicon Thin Film Transistors," 10 Semicond. Sci. Tech., pp. 721-738 (1995).

H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491-4498 (1994).

E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).

Y. Miyata et al, "Low-Temperature Polycrystalline Silicon Thin-Film Transistors for Large-Area Liquid Crystal Display," 31 Japanese J. of Applied Physics Part 1—Regular Papers Short Notes & Review Papers, pp. 4559-4562 (1992).

Im et al., "Phase Transformation Mechanisms Involved in Excimer Laser Crystallization of Amorphous Silicon Films," Appl. Phys. Lett., vol. 63 (14), p. 1969 (1993).

Im et al., "On the Super Lateral Growth Phenomenon Observed in Excimer Laser-Induced Crystallization of Thin Si Films," Appl. Phys. Lett., vol. 64 (17), p. 2303 (1994).

Brochure from MicroLas Lasersystem, GmbH, "UV Optics Systems for Excimer Laser Based Micromaching and Marking". No date.

Ishida et al., "Ultra-shallow boxlike profiles fabricated by pulsed ultraviolet-laser doping process", J. Vac. Sci. Technol. B 12(1), p. 399-403, 1994. (No month).

Yoshimoto, et al., "Excimer-Laser-Produced and Two-Dimensionally Position-Controlled Giant Si Grains on Organic SOG Underlayer", p. 285-286, AM-LCD 2000. No month.

Ozawa et al., "Two-Dimensionally Position-Controlled Exicer-Laser-Crystallization of Silicon Thin Films on Glassy Substrate", Jpn. J. Appl. Phys. vol. 38, Part 1, No. 10, p. 5700-5705, (1999). No month.

I.W. Boyd, Laser Processing of Thin Films and Microstructures, Oxidation, Deposition, and Etching of Insulators (Springer—Verlag Berlin Heidelber 1987).

N. Yamamuchi and R. Reif, J. Appl. Phys 75 (1994) 3235.

T. Noguchi, Jpn. Appl. Phys. 32 (1993) L1585.

Ishihara et al., "A Novel Double-Pulse Exicem-Laser Crystallizaion Method of Silicon Thin-Films," Japanese Journal of Applied Physics, Publication Office Japanes Journal of Applied Physics, Tokyo, Japan, vol. 34, No. 8A, Aug. 1995, pp. 3976-3981.

Kim, H. J., "Excimer-Laser-Induced Crystallization of Amorophus Silicon Thin Films", Ph. D. Dissertation Abstract, Columbia University, 1996.

* cited by examiner

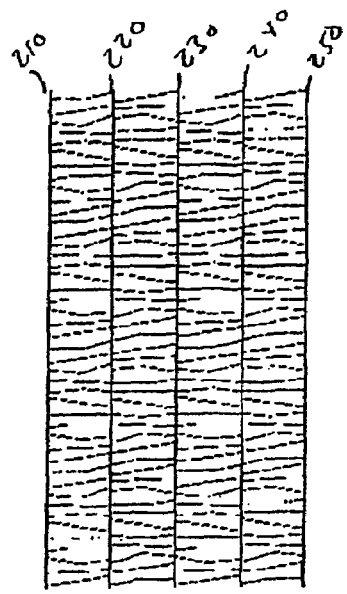
Figure 2a
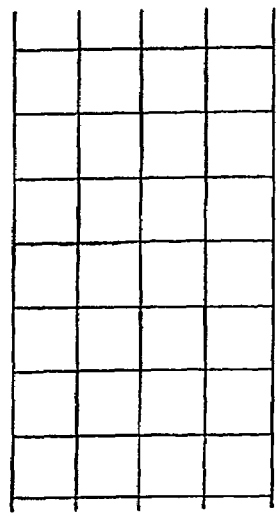
Figure 2b
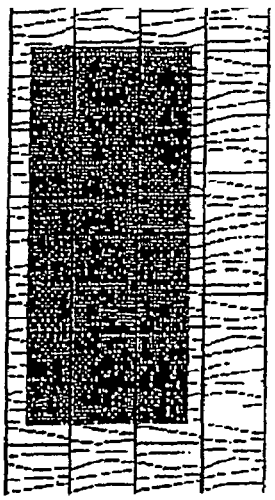
Figure 2c
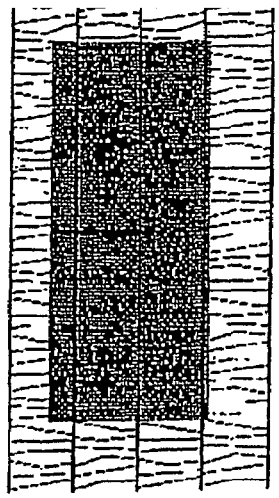
Figure 2d
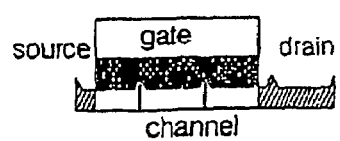
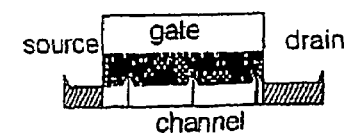
Prior Art

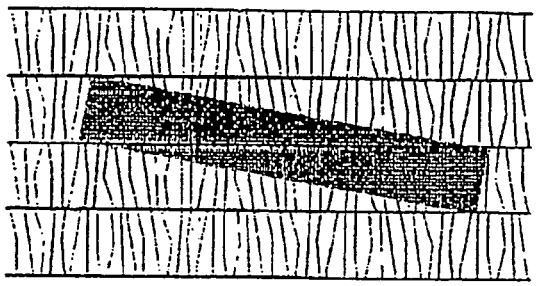
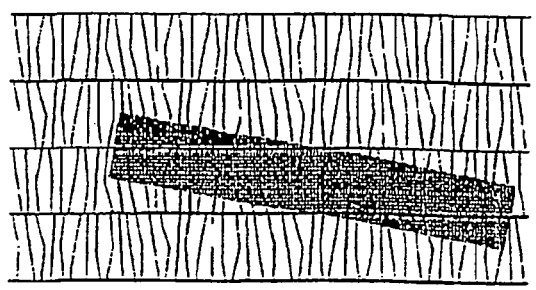
figure 3. n = 1 and m = 1, θ = 10°
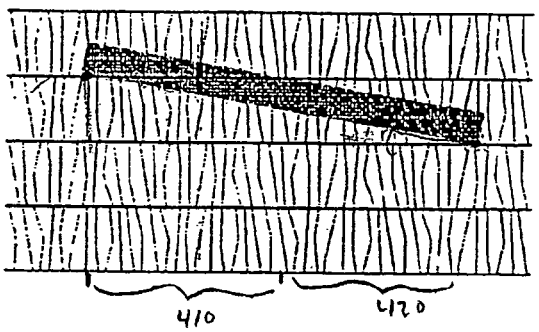
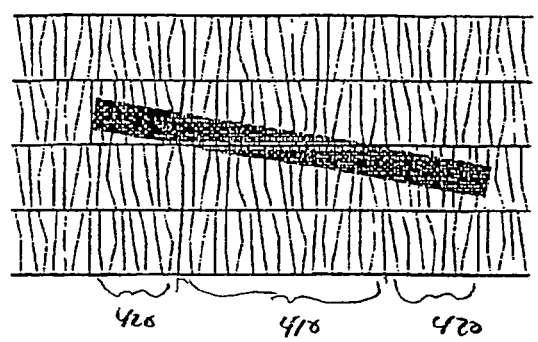
figure 4. n = 0.5, m = 1, θ = 10°
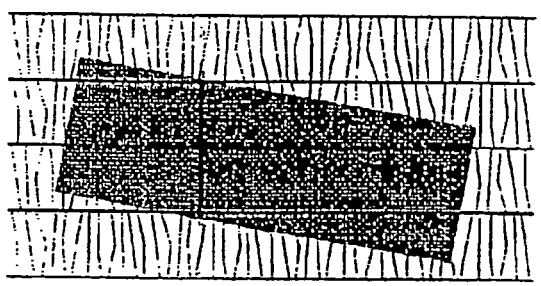
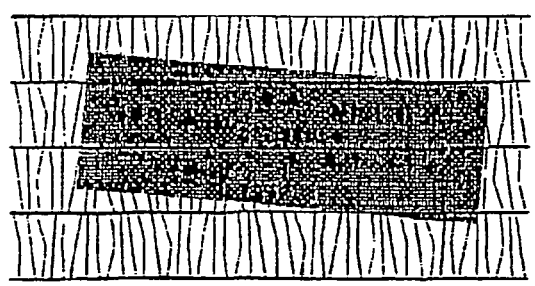
figure 5. left: n = 2.1, m = 1, θ = 10°, right: n = 2.1, m ~ 0.5, θ = 5°

POLYCRYSTALLINE TFT UNIFORMITY THROUGH MICROSTRUCTURE MIS-ALIGNMENT

CROSS-REFERENCE TO RELATED APPLICATIONS

This application is a 371 of PCT/US02/27246 which claims benefit of provisional No. 60/315,181, filed on Aug. 27, 2001, which is incorporated herein by reference for all purposes and from which priority is claimed.

BACKGROUND OF THE INVENTION

1. Technical Field

The present invention relates to semiconductor processing techniques, and more particularly, techniques for fabricating semiconductors suitable for use at thin-film transistor ("TFT") devices.

2. Background Art

Semiconductor films, such as silicon films, are known to be used for providing pixels for liquid crystal display devices and organic light emitting diode display devices. Such films are commonly processed via excimer laser annealing ("ELA") methods, where an amorphous silicon film is irradiated by an excimer laser to be crystallized.

Significant effort has gone into the refinement of "conventional" ELA (also known as line-beam ELA) processes in the attempt to improve the performance of the TFT devices placed on the processed semiconductor thin films. For example, U.S. Pat. No. 5,766,989 issued to Maegawa et al., the entire disclosure of which is incorporated herein in its entirety by reference, describes the ELA methods for forming polycrystalline thin film and a method for fabricating a TFT. The '989 patent attempts to address the problem of non-uniformity of characteristics across the substrate, and provide certain options for apparently suppressing such non-uniformities.

However, the details of the beam-shaping approach used in conventional ELA methods make it extremely difficult to reduce the non-uniformities in the semiconductor films and to improve the performance characteristics of such films. For example, in a low-temperature polycrystalline silicon ("LTPS") process, when the size of the grains becomes comparable to the dimensions of the channel region of the TFT, large device-to-device non-uniformity results. This is caused by the randomness of the microstructure, i.e., the random location of the grains and thus the grain boundaries. Such non-uniformity, especially when perpendicular to the current flow, can act as a current barrier. Further, when the transistor is in its off-state, carriers are generated at the grain boundary, which contribute to the off-current. This is especially the case when the grain boundary is in or close to the drain-channel junction.

Therefore, it has been realized that control over the microstructure is needed in order to ensure a uniform TFT process, both with respect to periodicity and location. Regarding the former, the film should be uniform, exhibiting periodicity in the location of the grains and thus the grain boundaries. Regarding the latter, the location of the grains and thus the grain boundaries should be controlled so that their contribution to the electrical characteristics is the same for every single device.

In an pulsed-laser, e.g., an excimer laser, irradiaton process to obtain LTPS films, control over the TFT microstructure may be obtained through the use lithography to induce such periodicity. The use of lithography also accounts for location control, since the accurate alignment procedure of the lithographic process is used. Unfortunately, the use of lithography requires at lease one extra processing step, which in turn increases complexity and thus costs.

Alternatively, control over the TFT microstructure may be obtained through the use of sequential lateral solidification ("SLS") techniques. For example, in U.S. Pat. No. 6,322,625 issued to Im and U.S. patent application Ser. No. 09/390,537 (the "'537 application"), which is assigned to the common assignee of the present application, the entire disclosures of which are incorporated herein by reference, particularly advantageous apparatus and methods for growing large grained polycrystalline or single crystal silicon structures using energy-controllable laser pulses and small-scale translation of a silicon sample to implement sequential lateral solidification have been described. As described in these patent documents, at least portions of the semiconductor film on a substrate are irradiated with a suitable radiation pulse to completely melt such portions of the film throughout their thickness. In this manner, when the molten semiconductor material solidifies, a crystalline structure grows into the solidifying portions from selected areas of the semiconductor film which did not undergo a complete melting. Thereafter, the beam pulses irradiate slightly offset from the crystallized areas so that the grain structure extends into the molten areas from the crystallized areas.

Using the system shown in FIG. 1, an amorphous silicon thin film sample is processed into a single or polycrystalline silicon thin film by generating a plurality of excimer laser pulses of a predetermined fluence, controllably modulating the fluence of the excimer laser pulses, homogenizing the modulated laser pulses in a predetermined plane, masking portions of the homogenized modulated laser pulses into patterned beamlets, irradiating an amorphous silicon thin film sample with the patterned beamlets to effect melting of portions thereof corresponding to the beamlets, and controllably translating the sample with respect to the patterned beamlets and with respect to the controlled modulation to thereby process the amorphous silicon thin film sample into a single or polycrystalline silicon thin film by sequential translation of the sample relative to the patterned beamlets and irradiation of the sample by patterned beamlets of varying fluence at corresponding sequential locations thereon.

While the system of FIG. 1 is highly advantageous in generating uniform, high quality polycrystalline silicon and single crystal silicon which exhibit periodicity and thereby solves a problem inherent with conventional ELC techniques, the technique does adequately not account for control over grain boundaries. For example, in the simplest form, SLS requires two pulses to crystallize the amorphous precursor into an LTPS film with partial periodicity, e.g., the 2-shot material shown schematically in FIG. 2a. The periodicity is only in one direction, shown by long grain boundaries 210, 220, 230, 240, 250 that are parallel to each other and which also have a protrusion to them. However, the position of the short grain boundaries is not at all controlled. The spacing between the parallel grain boundaries can be increased, and this material is in general called n-shot material. Likewise, FIG. 2b shows a so-called 4-shot material in which the grain boundaries are periodic in both directions. Again, the spacing between the grain boundaries can be increased, and is generally referred to as 2n-shot material.

While SLS techniques offer periodicity, such techniques do not offer accurate control of the location of grain boundaries. Referring to FIGS. 2c–d, the LTPS film produced includes a varying number of long grain boundaries perpendicular to the current flow, and the possibility of having a perpendicular grain boundary in or out of a TFT drain region. Both problems become more severe when grain size is increasing and/or when channel dimensions are decreasing, i.e., when the size of the grains becomes comparable to the dimensions of the channel region. While there has been a suggestion in U.S. Pat. No. 6,177,301 to Jung to misalign TFT channel regions with respect to the grain growth direction, that suggestion is made without taking into account the underlying need to maintain uniformity in TFT microstructure. Accordingly, there exists a need for a TFT manufacturing technique that provides for control over both the periodicity of grain boundaries and the location of TFTs in order to provide for uniformity in TFT microstructure.

SUMMARY OF THE INVENTION

An object of the present invention is to provide a TFT manufacturing technique that provides for control over both the periodicity of grain boundaries and the location of TFTs in order to provide for uniformity in TFT microstructure.

Another object of the present invention is to provide a device having uniformity in TFT microstructure.

In order to meet these and other objects of the present invention which will become apparent with reference to further disclosure set forth below, the present invention provides methods of making a polycrystalline silicon thin-film transistor having a uniform microstructure. One exemplary method requires receiving a polycrystalline silicon thin film having a grain structure which is periodic in at least a first direction, and placing at least portions of one or more thin-film transistors on the received film such that they are tilted relative to the periodic structure of said thin film. The polycrystalline silicon thin film may be formed by a sequential lateral solidification process, e.g., a two shot sequential lateral solidification process.

Advantageously, the portions of said one or more thin-film transistors may be active channel regions having a width W. Where the periodic structure of the thin film is $\lambda$ and m is a variable, the placing step involves placing active channel regions on the received film such that they are tilted at an angle $\theta$ relative to said periodic structure of said thin film, where $W \sin(\theta) = m\lambda$. The variable m is selected such that that the number of grain boundaries in any of the one or more thin-film transistors remains relatively controlled, and is preferably approximately equal to an integer.

The present invention also provides a device including a polycrystalline silicon thin-film transistor having a uniform microstructure. In an exemplary embodiment, the device includes polycrystalline silicon thin film having a grain structure which is periodic in at least a first direction, and at least portions of one or more thin-film transistors, placed on the thin film such that they are tilted relative to said periodic structure of the film.

The accompanying drawings, which are incorporated and constitute part of this disclosure, illustrate preferred embodiments of the invention and serve to explain the principles of the invention.

BRIEF DESCRIPTION OF THE DRAWINGS

FIGS. 2a–b are illustrative diagrams showing exemplary processed silicon samples using the prior art system of FIG. 1;

FIGS. 2c–d are illustrative diagrams showing the prior art placement of active channel regions of TFTs on the exemplary processed silicon samples shown in FIG. 2a;

FIGS. 3a–b are illustrative diagrams showing the placement of active channel region of TFTs on the exemplary processed silicon samples shown in FIG. 2a in accordance with the present invention;

FIGS. 4a–b are illustrative diagrams showing the placement of active channel region of TFTs on the exemplary processed silicon samples shown in FIG. 2a in accordance with the present invention; and FIGS. 5a–b are illustrative diagrams showing the placement of active channel region of TFTs on the exemplary processed silicon samples shown in FIG. 2a in accordance with the present invention.

Figure 1:
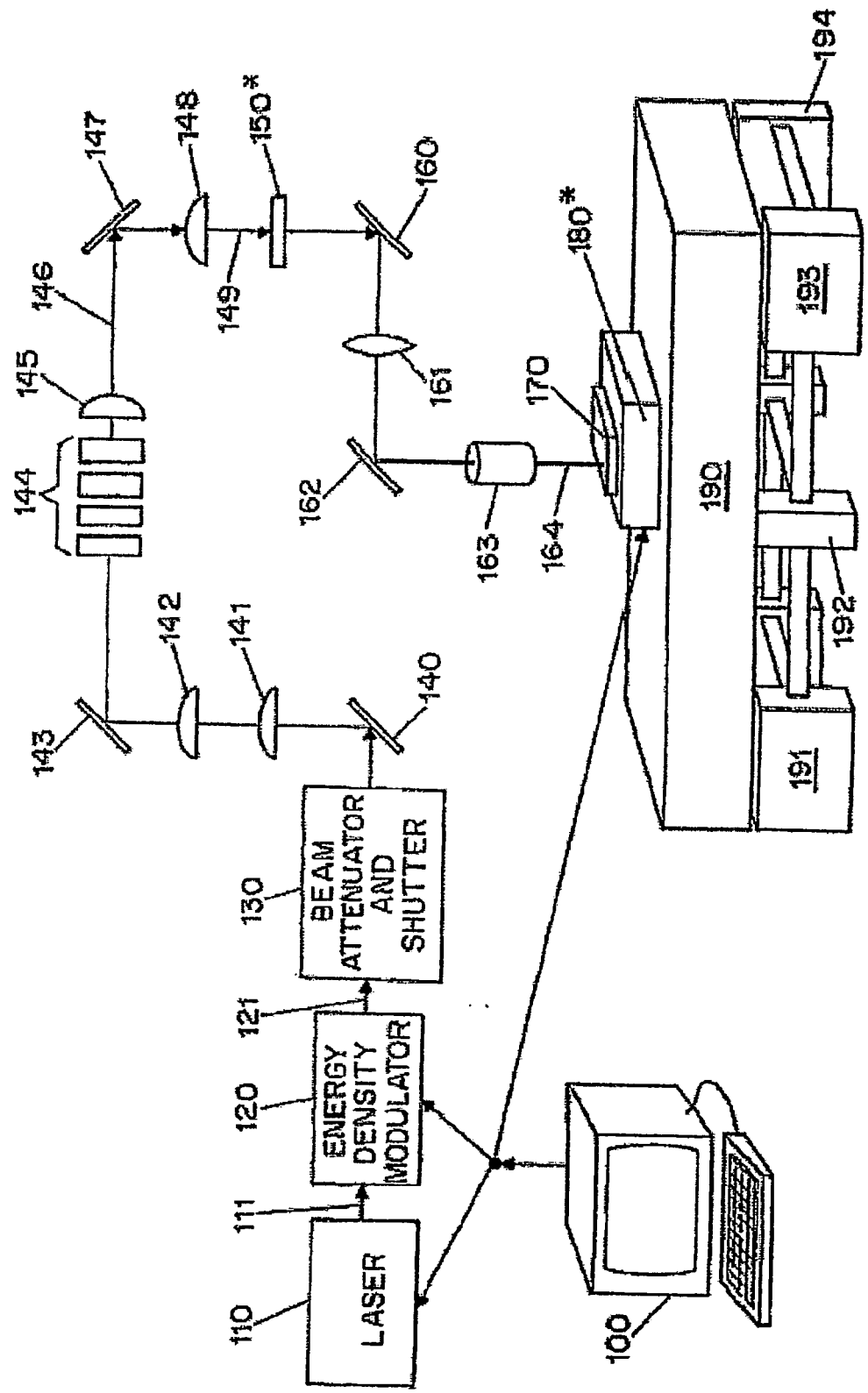
FIG. 1 is a functional diagram of a prior art system for performing semiconductor processing including sequential lateral solidification.

Throughout the FIGS., the same reference numerals and characters, unless otherwise stated, are used to denote like features, elements, components or portions of the illustrated embodiments. Moreover, while the present invention will now be described in detail with reference to the FIGS., it is done so in connection with the illustrative embodiments.

DETAILED DESCRIPTION OF THE PREFERRED EMBODIMENTS

Referring again to FIGS. 2a–b, exemplary processed silicon thin films using the prior art SLS system of FIG. 1 are shown. In particular, FIG. 2a illustrates a sample processed by irradiating a region with a single excimer laser pulse, micro-translating the sample, and irradiating the region with a second excimer laser pulse. While the following exemplary description of the invention will be with respect to this so-called "2-shot" material as an example, those skilled in the art will appreciate that the present invention is more broadly applicable to silicon thin films that have been processed with n-shot and 2n-shot SLS techniques.

In accordance with the present invention, active channel regions of TFTs are deliberately tilted relative to the periodic microstructure of the processed thin film. Such tilting may be accomplished by tilting the placement of the channel region itself on the processed thin film, or alternatively, by fabricating a thin film during SLS processing which includes a tilted periodic grain structure. A combination of both alternatives may also be employed.

The precise methodology for placing TFTs on the processed thin film is not important to the present invention, and hence any known technique may be employed. One exemplary technique is disclosed in U.S. Pat. No. 5,766,989 to Maegawa et al., the contents of which are incorporated by reference herein.

When the active channel regions of TFTs are deliberately tilted relative to the periodic microstructure of the processed thin film., the spread in the number of perpendicular or long grain boundaries becomes less, leading to an increased device-to-device uniformity. In accordance with the present invention, the tilting angle ($\theta$) should, however, not be too large, as not to increase the influence of the parallel, or short, grain boundaries. The ideal value of $\theta$ can be derived from equation (1), in which W is the width of the channel region, $\lambda$ is the spacing between the perpendicular grain boundaries, and m is preferably close to an integer in value:

$$W^* \sin(\theta) = m^* \lambda, \tag{1}$$

In order to measure performance N of the TFT, equation (2) may be employed, where L is the length of the channel region, and n is a determined ratio:

$$L \cos(\theta) = n^* \lambda, \tag{2}$$

In equation (2), a lower value of the ration n implies increased performance. L is often defined by the design rule of the process and is equal for all TFT's, and typically ranges from 3 to 6 μm. W, however, can be adjusted to match the requirements on the TFT properties, and typically ranges from 10 to 100 s μm. The spacing λ between the perpendicular brain boundaries typically ranges from 2 to 10 μm, but smaller and larger values are possible.

Referring next to FIGS. 3a–b, a first example of the present invention will be described. In this example, the ratio n=1, m=1, and θ=10 degrees. As shown in FIGS. 3a–b, all devices contain one perpendicular grain boundary, regardless of any translation of the TFT device, e.g., from the position shown in FIG. 3a to that shown in FIG. 3b.

Referring next to FIGS. 4a–b, a second example of the present invention will be described. In this example, the ratio n=0.5, m=1, and θ=10 degrees. As shown in FIGS. 4a–b, the channel region contains two portions, a first 410 in which one perpendicular grain boundary is present, and a second 420 in which no perpendicular grain boundary is present.

In latter portion 420, the device exhibits behavior as that of a TFT in fully directionally solidified material in which carriers are not hampered by grain boundaries. As shown in FIGS. 4a–b, the relative contribution of each of these two parts is again invariable to any translation of the device, e.g., from the position shown in FIG. 4a to that shown in FIG. 4b.

While the examples shown in FIGS. 3–4 are considered to be the ideal scenarios, where m is an integer, small deviations from use of an integer value may be used in accordance with the present invention. However, the deviation from an integer value must be selected such that the number of grain boundaries in any given TFT remains relatively controlled.

Referring next to FIGS. 5a–b, further examples of the present invention will be described. In FIG. 5a, the ratio n=2.1, m=1, and θ=10 degrees; in FIG. 5b, the ratio n=2.1, m=0.5, and θ=5 degrees. As shown in FIGS. 5a–b, for the ideal value of θ, the number of grain boundaries is again invariable to any translation of the device. However, when θ deviates from this value, translations increasingly change the number of grain boundaries. When n equals, or is very close to, an integer the number of grain boundaries is essentially invariant for changes in θ. Of course it should exceed a certain value to assure that the fraction of perpendicular grain that is in the drain region is also invariant to translations.

The foregoing merely illustrates the principles of the invention. Various modifications and alterations to the described embodiments will be apparent to those skilled in the art in view of the teachings herein. It will thus be appreciated that those skilled in the art will be able to devise numerous systems and methods which, although not explicitly shown or described herein, embody the principles of the invention and are thus within the spirit and scope of the invention.

The invention claimed is:

1. A method of making a polycrystalline device including two or more thin-film transistors of substantially uniform microstructure, comprising the steps of:
   (a) receiving a polycrystalline silicon thin film having a grain structure which is periodic in at least a first direction; and
   (b) placing at least portions of two or more thin-film transistors on said received film tilted at an angle relative to said periodic structure of said thin film, such that the number of long grain boundaries in any of said portions remains substantially uniform.

2. The method of claim 1, wherein said receiving step comprises the step of receiving a polycrystalline silicon thin film formed by a sequential lateral solidification process.

3. The method of claim 1, wherein said portions of said two or more thin-film transistors comprise active channel regions having a width W.

4. The method of claim 3, wherein said periodic structure of said thin film is λm is a variable, and said placing step comprises the step of placing said active channel regions on said received film such that said active channel regions are tilted at an angle θ relative to said periodic structure of said thin film, where $W \sin(\theta) = m\lambda$.

5. The method of claim 4, wherein m substantially equal to an integer.

6. The method of claim 4, wherein m is equal to an integer.

7. The method of claim 4, wherein m is equal to the integer 1.

8. A method of making a device including thin-film transistors, comprising the steps of:
   (a) receiving a polycrystalline silicon thin film having a grain structure which is periodic in at least a first direction in an amount λ; and
   (b) placing at least portions of one or more thin-film transistors having a width W on said received film tilted at an angle θ relative to said periodic structure λ of said thin film, such that $W \sin(\theta) = m\lambda$, where m is substantially equal to an integer.

9. The method of claim 8, wherein said receiving step comprises the step of receiving a polycrystalline silicon thin film formed by a sequential lateral solidification process.

10. The method of claim 8, wherein said portions of said one or more thin-film transistors comprise active channel regions having a width W.

11. The method of claim 10, wherein m is equal to an integer.

12. The method of claim 10, wherein m is equal to the integer 1.

13. A device including two or more polycrystalline silicon thin-film transistors of substantially uniform microstructure, comprising:
   (a) a polycrystalline silicon thin film having a grain structure which is periodic in at least a first direction; and
   (b) at least two or more thin-film transistor portions placed on said polycrystalline silicon thin film, each tilted at an angle relative to said periodic structure of said thin film, such that that the number of long grain boundaries in any of said portions remains substantially uniform.

14. The device of claim 13, wherein said polycrystalline silicon thin film comprises thin film formed by a sequential lateral solidification process.

15. The device of claim 13, wherein said portions of said two or more thin-film transistors comprise active channel regions having a width W.

16. The device of claim 13, wherein said periodic structure of said thin film is λ, m is a variable, and said active channel regions are tilted at an angle θ relative to said periodic structure of said thin film, where $W \sin(\theta) = m\lambda$.

17. The device of claim 16, wherein m is substantially equal to an integer.

18. The device of claim 16, wherein m is equal to an integer.

19. The device of claim 16, wherein m is equal to the integer 1.

* * * * *